US010269920B2

(12) United States Patent
Cheng et al.

(10) Patent No.: US 10,269,920 B2
(45) Date of Patent: Apr. 23, 2019

(54) NANOSHEET TRANSISTORS HAVING THIN AND THICK GATE DIELECTRIC MATERIAL

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/825,527

(22) Filed: Nov. 29, 2017

(65) Prior Publication Data

US 2018/0233572 A1 Aug. 16, 2018

Related U.S. Application Data

(62) Division of application No. 15/434,437, filed on Feb. 16, 2017.

(51) Int. Cl.
*H01L 29/00* (2006.01)
*H01L 29/51* (2006.01)
(Continued)

(52) U.S. Cl.
CPC ............ *H01L 29/511* (2013.01); *B82Y 10/00* (2013.01); *H01L 29/0649* (2013.01);
(Continued)

(58) Field of Classification Search
CPC .......... H01L 29/0673; H01L 29/66545; H01L 29/66795
See application file for complete search history.

(56) References Cited

U.S. PATENT DOCUMENTS 9,406,748 B1 * 8/2016 Balakrishnan ...... H01L 21/3086
9,660,028 B1 * 5/2017 Cheng ................. H01L 29/0673
(Continued)

OTHER PUBLICATIONS

List of IBM Patents or Patent Applications Treated as Related; (Appendix P), Filed Nov. 29, 2017; 2 pages.
(Continued)

*Primary Examiner* — Nicholas J Tobergte
(74) *Attorney, Agent, or Firm* — Cantor Colburn LLP; David Quinn

(57) ABSTRACT

Provided is a method for forming a semiconductor structure. In embodiments, the method includes forming multiple channel nanosheets in multiple first stacks over a substrate. The channel nanosheets in the first stack define first stack cavities such that each pair of adjacent stacked channel nanosheets in the first stack is separated by one of the first stack cavities. The method further includes forming multiple channel nanosheets in a second stack over a substrate. The channel nanosheets in the second stack defining second stack cavities such that each pair of adjacent stacked channel nanosheets in the first second is separated by one of the second stack cavities. The method further includes filling the first stack cavities with a first gate dielectric material and filling the second stack cavities with a work function metal and a second gate dielectric material. The first gate dielectric material differs from the second gate dielectric material.

19 Claims, 15 Drawing Sheets

(51) Int. Cl.
  *H01L 29/66*   (2006.01)
  *H01L 29/06*   (2006.01)
  *H01L 29/423*  (2006.01)
  *H01L 29/786*  (2006.01)
  *H01L 29/775*  (2006.01)
  *B82Y 10/00*   (2011.01)
  *H01L 29/417*  (2006.01)

(52) U.S. Cl.
  CPC .... *H01L 29/0673* (2013.01); *H01L 29/41725* (2013.01); *H01L 29/4238* (2013.01); *H01L 29/42392* (2013.01); *H01L 29/517* (2013.01); *H01L 29/518* (2013.01); *H01L 29/66439* (2013.01); *H01L 29/66545* (2013.01); *H01L 29/66742* (2013.01); *H01L 29/775* (2013.01); *H01L 29/78696* (2013.01); *H01L 29/66795* (2013.01); *H01L 2029/42388* (2013.01)

(56) References Cited

U.S. PATENT DOCUMENTS

| | | | | |
|---|---|---|---|---|
| 9,722,022 B2* | 8/2017 | Leobandung | ....... | H01L 29/0676 |
| 9,735,250 B2* | 8/2017 | Ando | ................... | H01L 29/513 |
| 9,786,739 B2* | 10/2017 | Balakrishnan | ...... | H01L 29/0676 |
| 2015/0249086 A1* | 9/2015 | Divakaruni | ....... | H01L 21/76283 |
| | | | | 257/369 |

OTHER PUBLICATIONS

Kangguo Cheng, et al., "Nanosheet Transistors Having Thin and Thick Gate Dielectric Material", U.S. Appl. No. 15/434,437, filed Feb. 16, 2017.

* cited by examiner

NANOSHEET TRANSISTORS HAVING THIN AND THICK GATE DIELECTRIC MATERIAL

DOMESTIC PRIORITY

This application is a division of a U.S. application Ser. No. 15/434,437 filed Feb. 16, 2017, the disclosure of which is incorporated herein by reference in its entirety.

BACKGROUND

The present invention relates in general to semiconductor device fabrication methods and resulting structures. More specifically, the present invention relates to forming nanosheet transistors having thin and thick gate dielectric material.

In semiconductor device fabrication processes, a large number of semiconductor devices, such as field effect transistors (FETs), can be fabricated on a single wafer. Some non-planar device architectures, such as nanosheet FETs, provide increased device density and can provide increased performance over lateral device architectures. In a known nanosheet FET configuration, the gate wraps around the full perimeter of multiple nanosheet channels in a so-called gate-all-around (GAA) configuration, which enables fuller depletion in the channel regions and reduces short-channel effects due to, for example, steeper subthreshold swing (SS) and smaller drain induced barrier lowering (DIBL). The wrap-around gate structures can result in greater management of leakage current and parasitic capacitance in the active regions, even as drive currents increase.

SUMMARY

One or more embodiments of the invention provide a method for forming a semiconductor structure. The method includes forming multiple channel nanosheets in multiple first stacks over a substrate. The channel nanosheets in the first stack define first stack cavities such that each pair of adjacent stacked channel nanosheets in the first stack is separated by one of the first stack cavities. The method further includes forming multiple channel nanosheets in a second stack over a substrate. The channel nanosheets in the second stack define second stack cavities such that each pair of adjacent stacked channel nanosheets in the first second is separated by one of the second stack cavities. The method further includes filling the first stack cavities with a first gate dielectric material and filling the second stack cavities with a work function metal and a second gate dielectric material. The first gate dielectric material differs from the second gate dielectric material.

One or more embodiments of the invention provide a method for forming a semiconductor structure. The method includes forming multiple channel nanosheets in a first stack over a substrate. The channel nanosheets in the first stack define first stack cavities such that each pair of adjacent stacked channel nanosheets in the first stack is separated by one of the first stack cavities. The method further includes completely filling the first stack cavities with a first gate dielectric material.

One or more embodiments of the invention provide a semiconductor structure. The semiconductor structure includes a substrate and a first stack over the substrate. The first stack includes channel nanosheets and only a first gate dielectric material between each pair of adjacent stacked channel nanosheets.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1A:
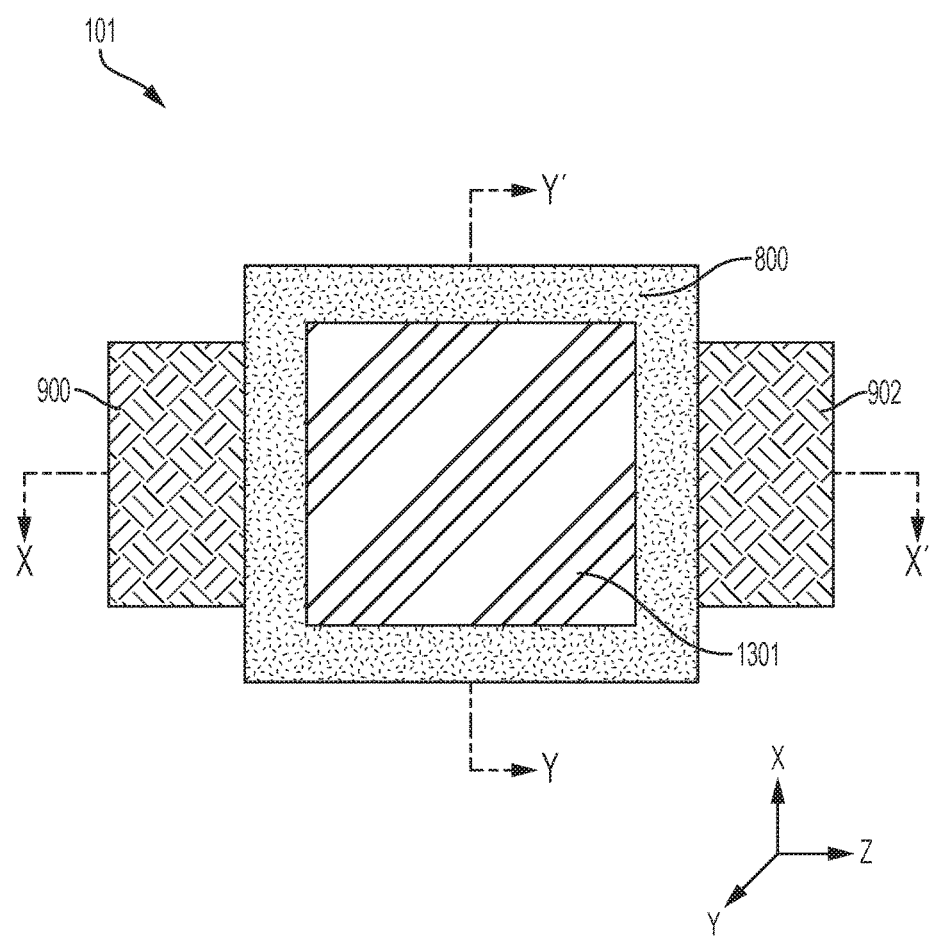
FIG. 1a depicts a top view of a semiconductor structure after a fabrication operation according to one or more embodiments of the present invention.

It is understood in advance that although a detailed description is provided herein of an exemplary n-type "wrap-around" or "gate-all-around" (GAA) nanosheet FET architecture having silicon (Si) channel nanosheets and silicon germanium (SiGe) sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer technology and below. The length of the gate is in a direction between the source and drain regions, and the width of the gate is in a direction orthogonal to the length.

Fabricating an IC can require both a thin gate dielectric material and thick gate dielectric material. For example, a thin gate dielectric material provides a low voltage, low power dissipation device and a thick gate dielectric material provides a high voltage, high speed, high current drive device.

After the sacrificial nanosheets are released from the channel nanosheets, cavities between adjacent channel nanosheets are thick enough for forming a metal gate and a thin dielectric surrounding the stacked channel nanosheets. However, the cavities between adjacent channel nanosheets can be insufficiently thick for a metal gate and a thick dielectric. For example, if the sacrificial nanosheets are about 8 nm thick, and if the thick dielectric is about 4 nm in thickness, after the thick dielectric material is deposited, the cavities between adjacent channel nanosheets will be completely occupied by the thick dielectric material, leaving no space for a gate metal. The thickness of the initial sacrificial nanosheets, which are subsequently removed to form the cavities, cannot be increased, as doing so would increase parasitic capacitance between the gate metal and source/drain regions.

Turning now to an overview of aspects of the present invention, one or more embodiments of the invention provide fabrication methods and resulting structures for nanosheets transistors, formed on a single substrate, that include thick gate dielectric material and thin gate dielectric material. The thick gate dielectric material pinches off (i.e., completely fills) in cavities between adjacent channel nanosheets of a nanosheet FET. A gate metal cannot be deposited between adjacent channel nanosheets and thus, cannot be deposited surrounding each of the nanosheet channels to provide GAA channel nanosheets. However, a gate metal is formed surrounding the stacked channel nanosheets collectively. When a voltage greater than a threshold voltage is applied to the gate metal, current flows through the sidewalls of the channel nanosheets, which are surrounded by the gate metal. Fabrication methods and resulting semiconductor device structures in accordance with embodiments are described in detail below by referring to the accompanying drawings in FIGS. 1-11.

Figure 1B:
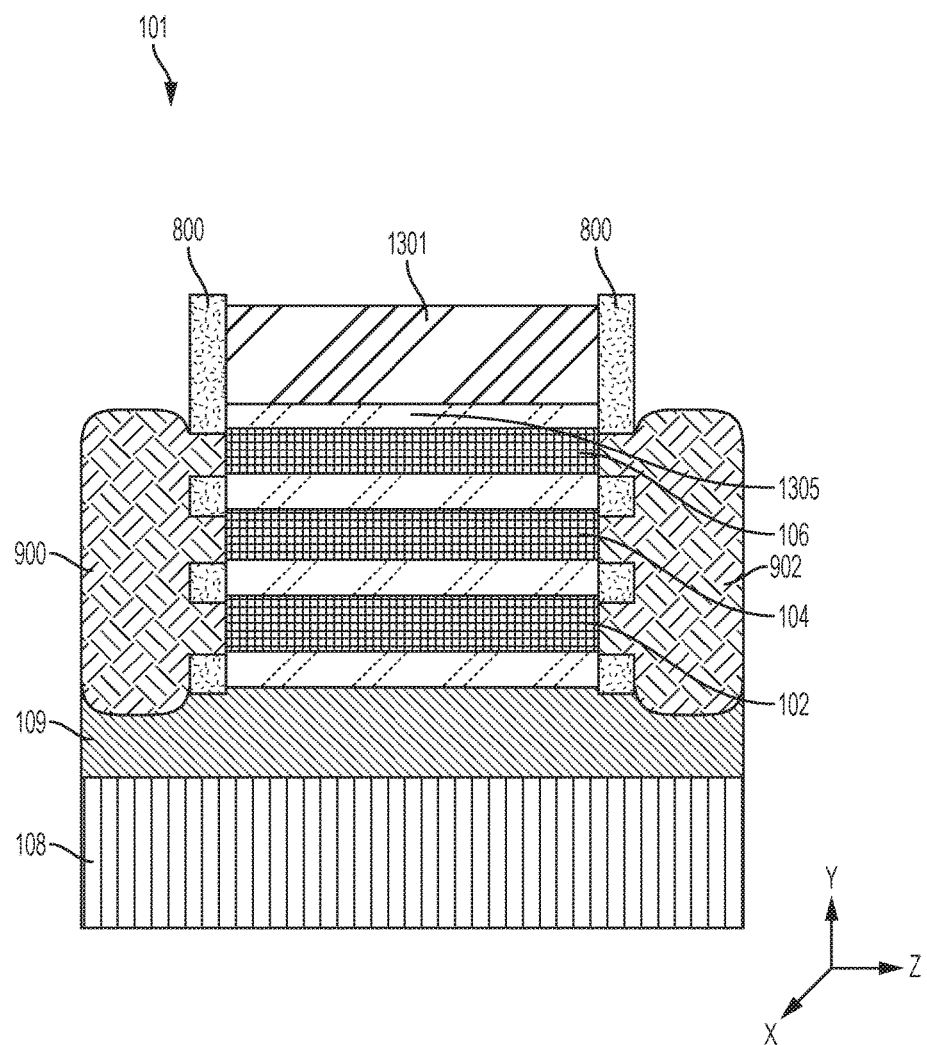
FIG. 1b depicts a cross-sectional view of the semiconductor structure shown in FIG. 1a, taken along line X-X'.
Figure 1C:
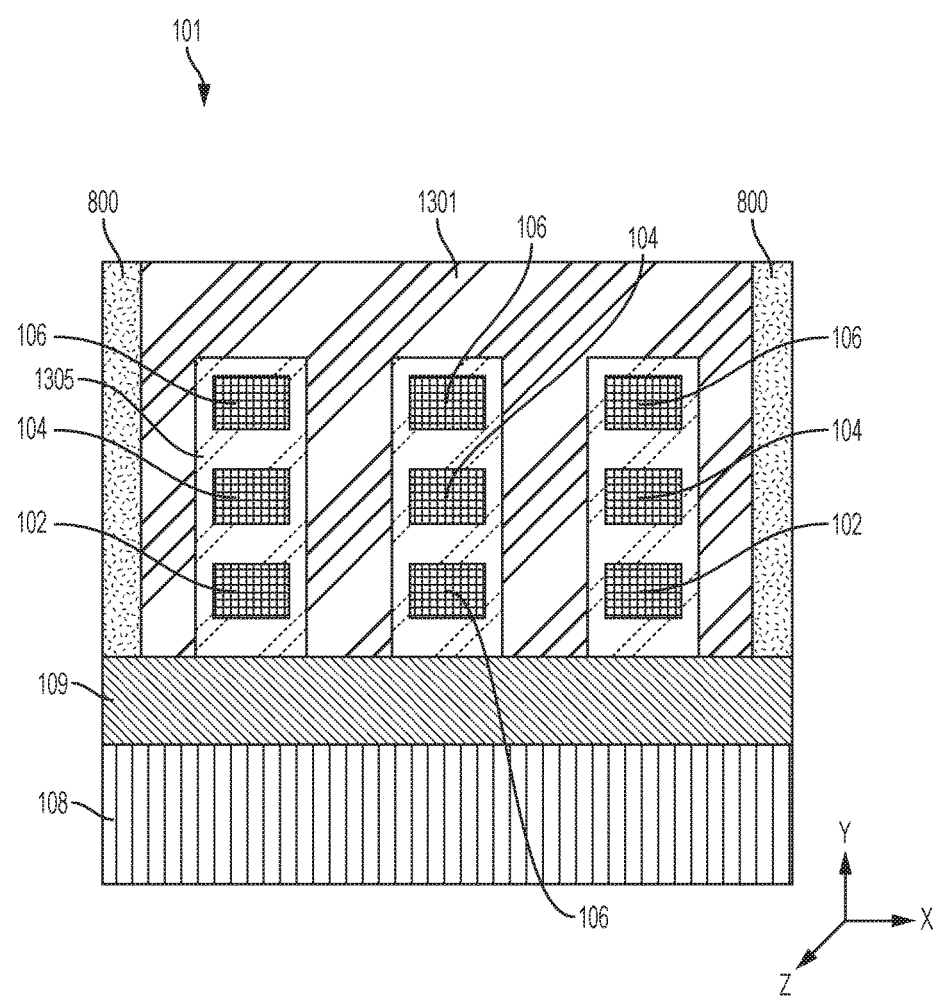
FIG. 1c depicts a cross-sectional view of the semiconductor structure shown in FIG. 1a, taken along line Y-Y'.

FIG. 1a depicts a top view of an FET structure 101 including a thick dielectric material in a gate dielectric layer according to one or more embodiments of the invention. FIG. 1b depicts a cross-sectional view of the FET structure 101 shown in FIG. 1a, taken along the line X-X'. FIG. 1c depicts a cross-sectional view of the FET structure 101 shown in FIG. 1a, taken along the line Y-Y'. As depicted in FIGS. 1b and 1c, a thick dielectric material 1305 is formed surrounding channel nanosheets, 102, 104, 106. Cavities between adjacent channel nanosheets 102, 104, 106 are completely filled only with thick dielectric material 1305, leaving no space for deposition of conductive gate metal 1301 between adjacent channel nanosheets 102, 104, 106. Accordingly, the conductive gate metal 1301 cannot be deposited surrounding each of the nanosheet channels to provide GAA channel nanosheets, as will be described in further detail below, referring, for example, to FIGS. 2a-2c.

However, the conductive gate metal 1301 is deposited surrounding the stacked channel nanosheets 102, 104, 106 collectively, and when a voltage greater than a threshold voltage is applied to the conductive gate metal 1301, current flows through the sidewalls of the channel nanosheets 102, 104, 106, which are surrounded by the conductive gate metal 1301. Thus, the sidewalls of the channel nanosheets 102, 104, 106 function as channel regions of the FET. Current can also flow through a top surface of the topmost channel nanosheet 106, which is also surrounded by the conductive gate metal 1301, and a top surface of the topmost channel nanosheet 106 can also function as a channel regions of the FET.

Conductive gate metal 1301 can include a work function metal, such as, for example, aluminum, lanthanum oxide, magnesium oxide, strontium titanate, strontium oxide, titanium nitride, titanium aluminum nitride, titanium aluminum carbide, tantalum nitride, or a combination thereof. In some embodiments of the invention, the conductive gate metal 1301 can include a conductive metal, such as, for example, tungsten.

The thick dielectric material 1305 can include, for example, silicon oxynitride, oxygenated high-k materials, or a combination thereof. Examples of oxygenated high-k materials include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate. The oxygenated high-k materials can further include dopants such as lanthanum, aluminum, or nitrogen. In some embodiments of the invention, the thick dielectric material 1305 can have a thickness of about 3 to about 5 nm, about 3.5 to about 4 nm, or about 4 nm. Formation of spacers 800 and doped regions 900 and 902 as depicted in FIGS. 1a-1c will be described in further detail below, referring, for example, to FIGS. 8-10.

Figure 2A:
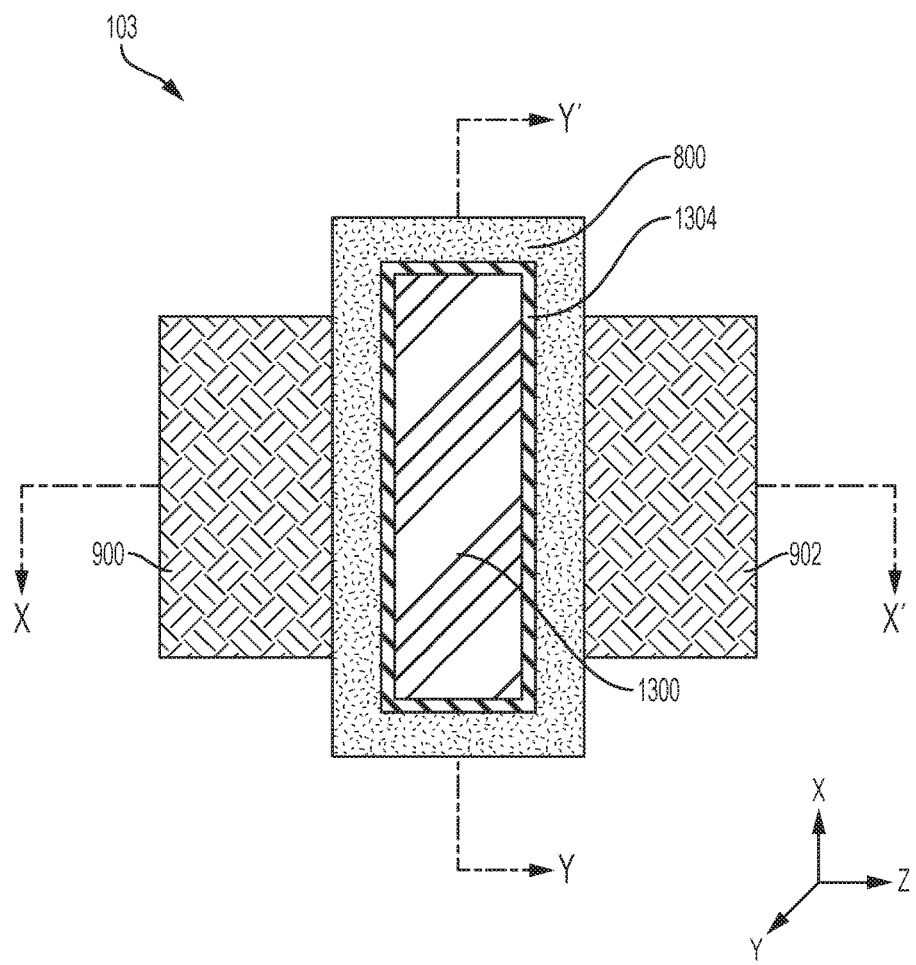
FIG. 2a depicts a top view of a semiconductor structure after a fabrication operation according to one or more embodiments of the present invention.
Figure 2B:
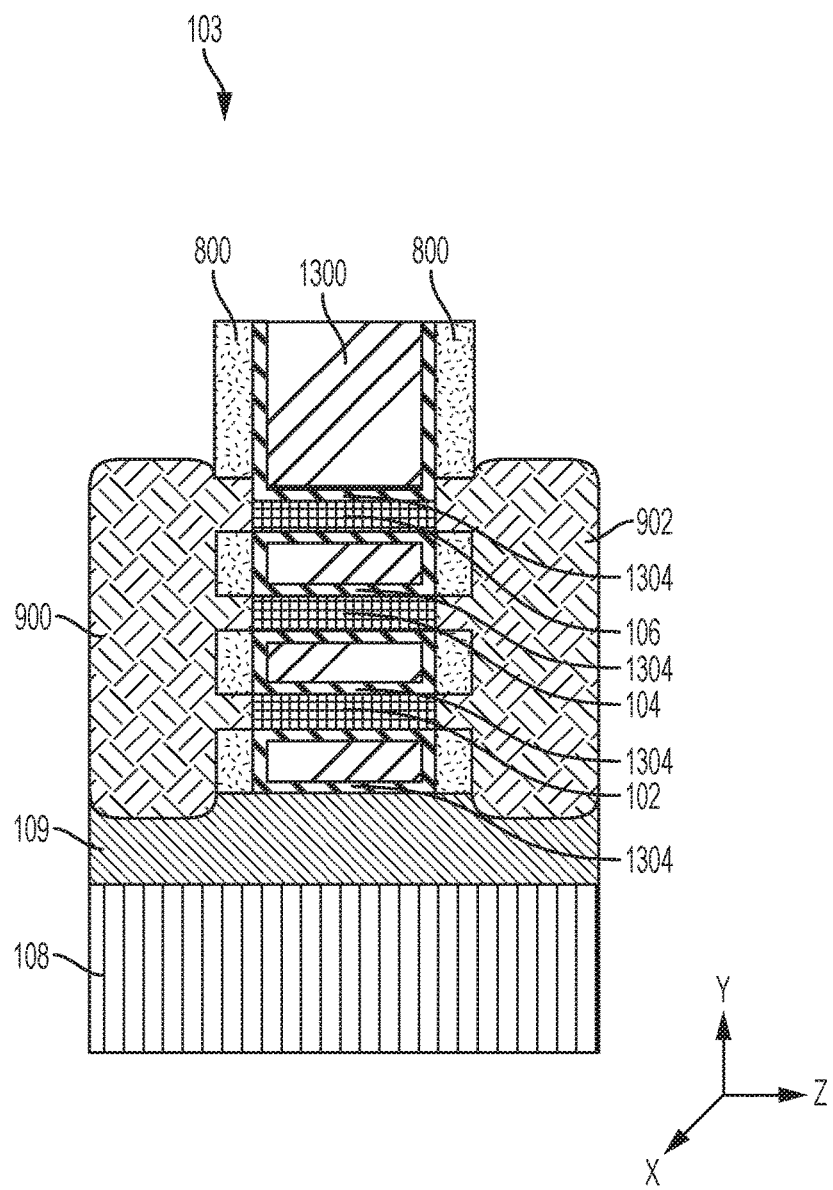
FIG. 2b depicts a cross-sectional view of the semiconductor structure shown in FIG. 2a, taken along the line X-X'.
Figure 2C:
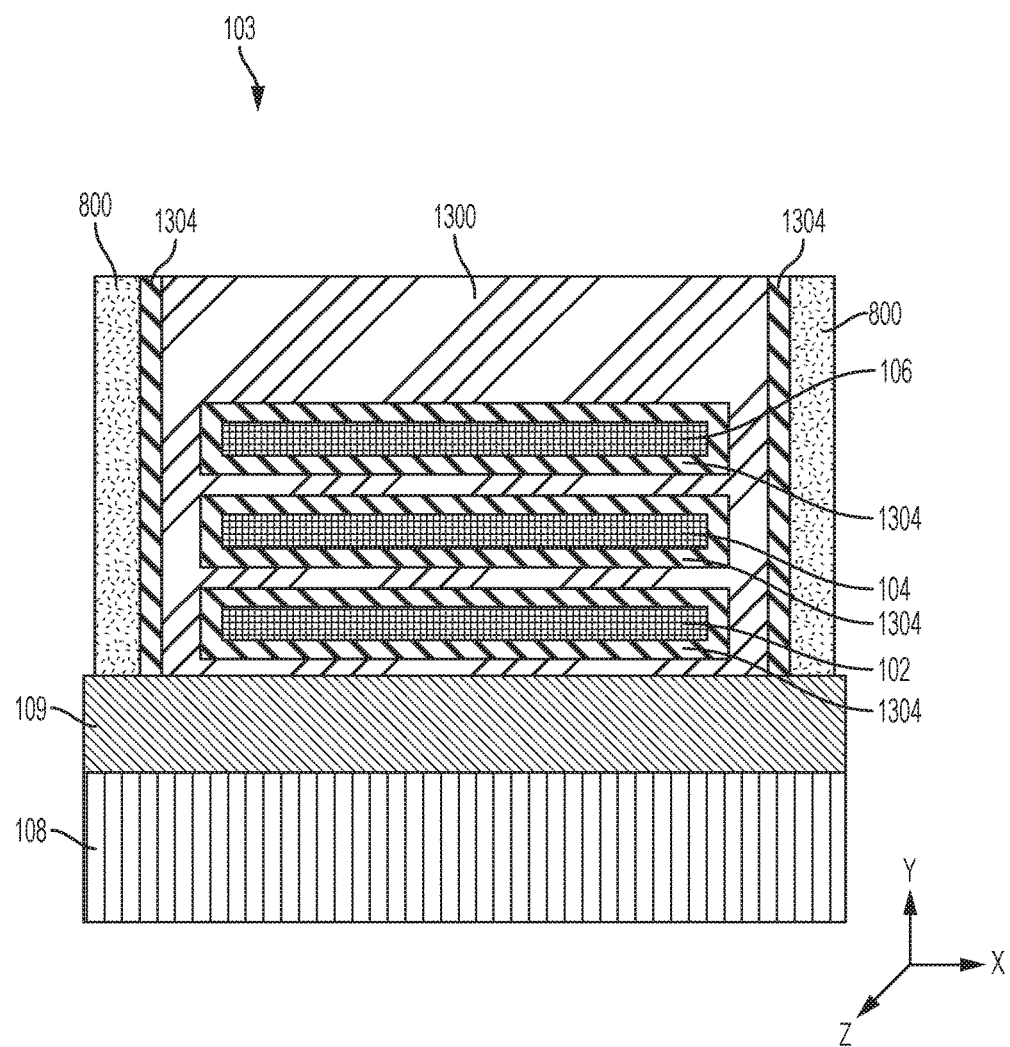
FIG. 2c depicts a cross-sectional view of the semiconductor structure shown in FIG. 2a, taken along the line Y-Y'.

FIG. 2a depicts a top view of a FET structure 103 including a thin dielectric material in a gate dielectric layer according to one or more embodiments of the invention. FIG. 2b depicts a cross-sectional view of the FET structure 103 shown in FIG. 2a, taken along the line X-X'. FIG. 2b depicts a cross-sectional view of the FET structure 103 shown in FIG. 2a, taken along the line Y-Y'. As depicted in FIGS. 2b and 2c, thin dielectric material 1304 and a conductive gate metal 1300 are formed around the channel nanosheets 102, 104, 106, e.g., in a GAA configuration. When a voltage greater than a threshold voltage is applied to the conductive gate metal 1301, current flows through the sidewalls of the channel nanosheets 102, 104, 106, a top surface of the channel nanosheets 102, 104, 106, and a bottom surface of the channel nanosheets 102, 104, 106, which are surrounded by the conductive gate metal 1301. The conductive gate metal 1300 can include a same material as the conductive gate metal 1301.

Conductive gate metal 1300 can include a work function metal, such as, for example, aluminum, lanthanum oxide, magnesium oxide, strontium titanate, strontium oxide, titanium nitride, titanium aluminum nitride, titanium aluminum carbide, tantalum nitride, or a combination thereof. In some embodiments of the invention, the conductive gate metal 1300 can include a conductive metal, such as, for example, tungsten.

In some embodiments of the invention, the thin dielectric material 1304 can further modify the work function of each respective gate. The thin dielectric material 1304 can include, for example, silicon nitride, boron nitride, high-k materials, or a combination thereof. Examples of high-k materials include, for example, hafnium or zirconium. The high-k materials can further include dopants such as lanthanum, aluminum, or nitrogen. Formation of spacers 800 and doped regions 900 and 902 as depicted in FIGS. 2a-2c will be described in further detail below, referring, for example, to FIGS. 8-10.

Figure 3:
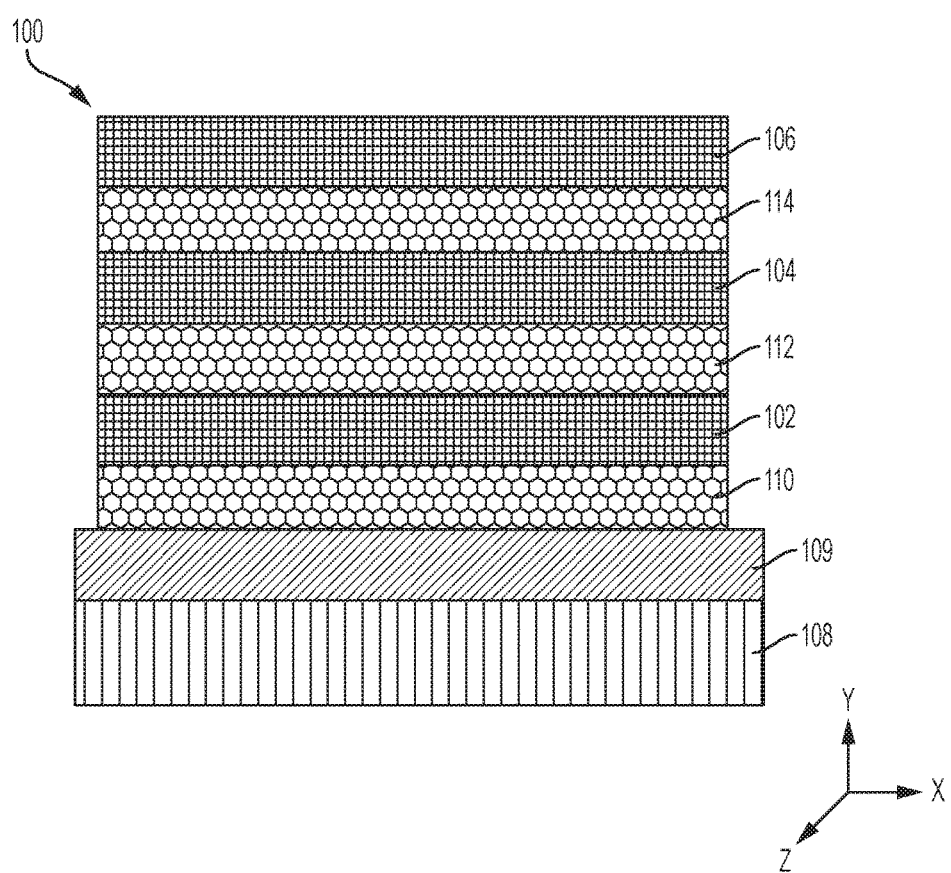
FIG. 3 depicts a cross-sectional view of a semiconductor structure after a fabrication operation according to one or more embodiments of the present invention.

FIG. 3 depicts a cross-sectional view of a semiconductor structure 100 having channel nanosheets 102, 104, 106 and sacrificial nanosheets 110, 112, 114 (collectively referred to as a nanosheet stack) formed on a substrate 108 during a fabrication method according to one or more embodiments of the invention. In some embodiments of the invention, the channel nanosheets 102, 104, 106 are formed from Si, and the sacrificial nanosheets 110, 112, 114 are formed from SiGe. For ease of discussion, reference is made to operations performed on and to a nanosheet stack having three channel nanosheets (e.g., channel nanosheets 102, 104, 106) alternating with three sacrificial nanosheets (e.g., nanosheets 110, 112, 114). In some embodiments of the invention, the nanosheet stack can include any number of channel nanosheets alternating with a corresponding number of sacrificial nanosheets. For example, the nanosheet stack can include any number of channel nanosheets, along with a corresponding number of sacrificial nanosheets.

In one or more embodiments of the invention, the alternating series of channel nanosheets 102, 104, 106 and sacrificial nanosheets 110, 112, 114 are formed by epitaxially growing one layer and then the next until the desired number and desired thicknesses of the nanosheets are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The channel nanosheets 102, 104, and 106 can include, for example, monocrystalline Si. The channel nanosheets 102, 104, and 106 can have a thickness of, for example, from about 4 to about 10 nm, about 6 nm, or about 8 nm. In embodiments where the sacrificial nanosheets 110, 112, 114 include SiGe, for example, the SiGe content can be 50 atomic %. The sacrificial nanosheets 110, 112, 114 can have a thickness of, for example, from about 6 to about 10 nm or from about 7 to about 8 nm. The substrate 108 can be a bulk semiconductor material that includes, for example, monocrystalline Si, SiGe, SiC, III-V compound semiconductor, II-VI compound semiconductor, or semiconductor-on-insulator (SOI). In some embodiments of the invention, the substrate 108 can include a buried oxide layer (BOX) 109.

Figure 4:
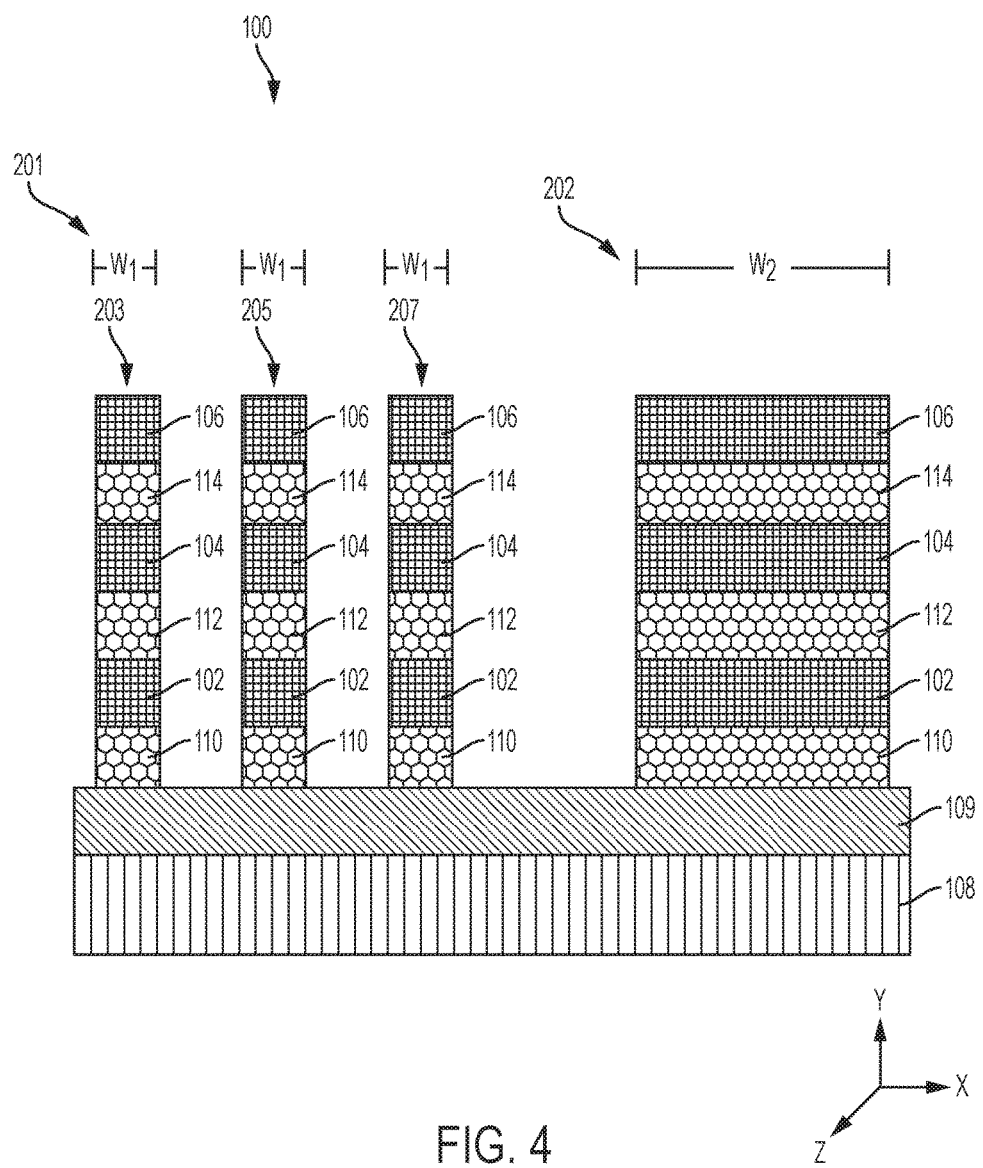
FIG. 4 depicts a cross-sectional view of the semiconductor structure including nanosheet stacks after a fabrication operation according to one or more embodiments of the present invention.

FIG. 4 depicts a cross-sectional view of the semiconductor structure 100 after patterning and removal of portions of the channel nanosheets 102, 104, 106 and the sacrificial nanosheets 110, 112, 114 (i.e., the nanosheet stack) to expose portions of the BOX 109 during an intermediate fabrication operation according to one or more embodiments of the invention. The portions of the channel nanosheets 102, 104, 106 and the sacrificial nanosheets 110, 112, 114 can be removed using, for example, a sidewall image transfer (SIT) operation, a wet etch process, or a dry etch process. The patterning and removal define a first set of nanosheet stacks 201, which include multiple narrow nanosheet stacks 203, 205, 207. The patterning and removal further define a second nanosheet stack 202, which is a single wide nanosheet stack.

The narrow nanosheet stacks 203, 205, 207 are used to form the extended-gate FET structure 101, and the single wide nanosheet stack 202 is used to form the single-gate FET structure 103. The tightly-pitched narrow nanosheet stacks 203, 205, 207 can take the form of nanowires having a width ($W_1$) in an X-direction of, for example, about 10 nm, and a gate length in a Z-direction of about 40 nm to about 100 nm. In some embodiments of the invention, the single wide nanosheet stack 202 can have a width ($W_2$) in the X-direction of about 40 nm and a gate length in the Z-direction of about 15 to about 20 nm.

Figure 5:
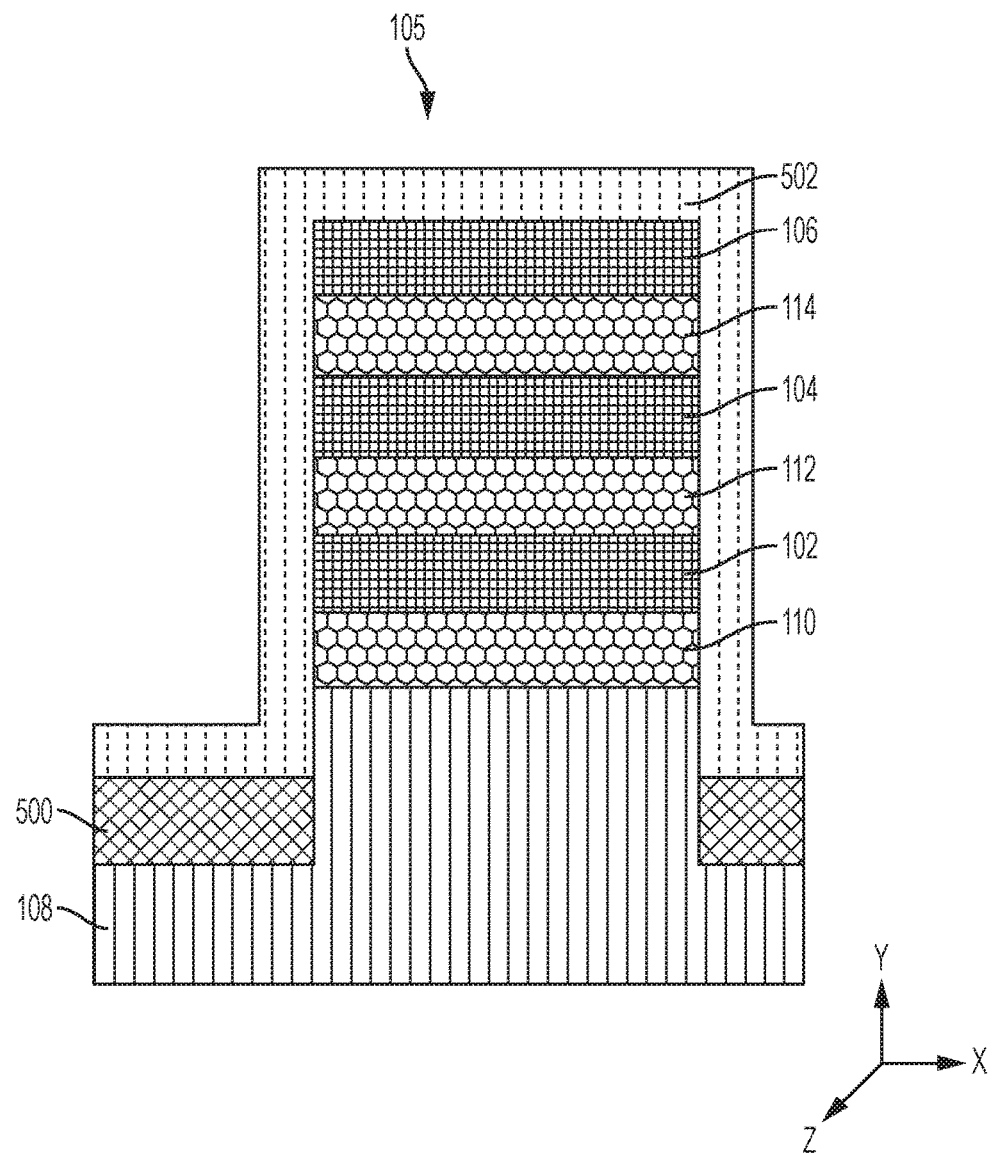
FIG. 5 depicts a cross-sectional view of a nanosheet stack shown in FIG. 4 after a fabrication operation according to one or more embodiments of the present invention.

FIG. 5 depicts a cross-sectional view of the nanosheet stack 202 shown in FIG. 4 after forming a shallow trench isolation (STI) 500 on the exposed portions of the substrate 108 during a method of fabricating a semiconductor structure 105 according to one or more embodiments of the invention. While not depicted in FIGS. 5-11, the fabrication operations depicted in FIGS. 5-11 are simultaneously performed on the collective first set of nanosheet stacks 201 of the semiconductor structure 100. Additionally, while not depicted in FIGS. 5-11, the substrate 108 can include a BOX, as described above.

The STI 500 can prevent electrical current leak between adjacent semiconductor device components. The STI 500 can include, for example, a silicon oxide. In some embodiments of the invention, the STI 500 can be etched via an etch back after a CMP process. In some embodiments of the invention, oxide layer 502 can be formed over the nanosheet stacks.

Figure 6:
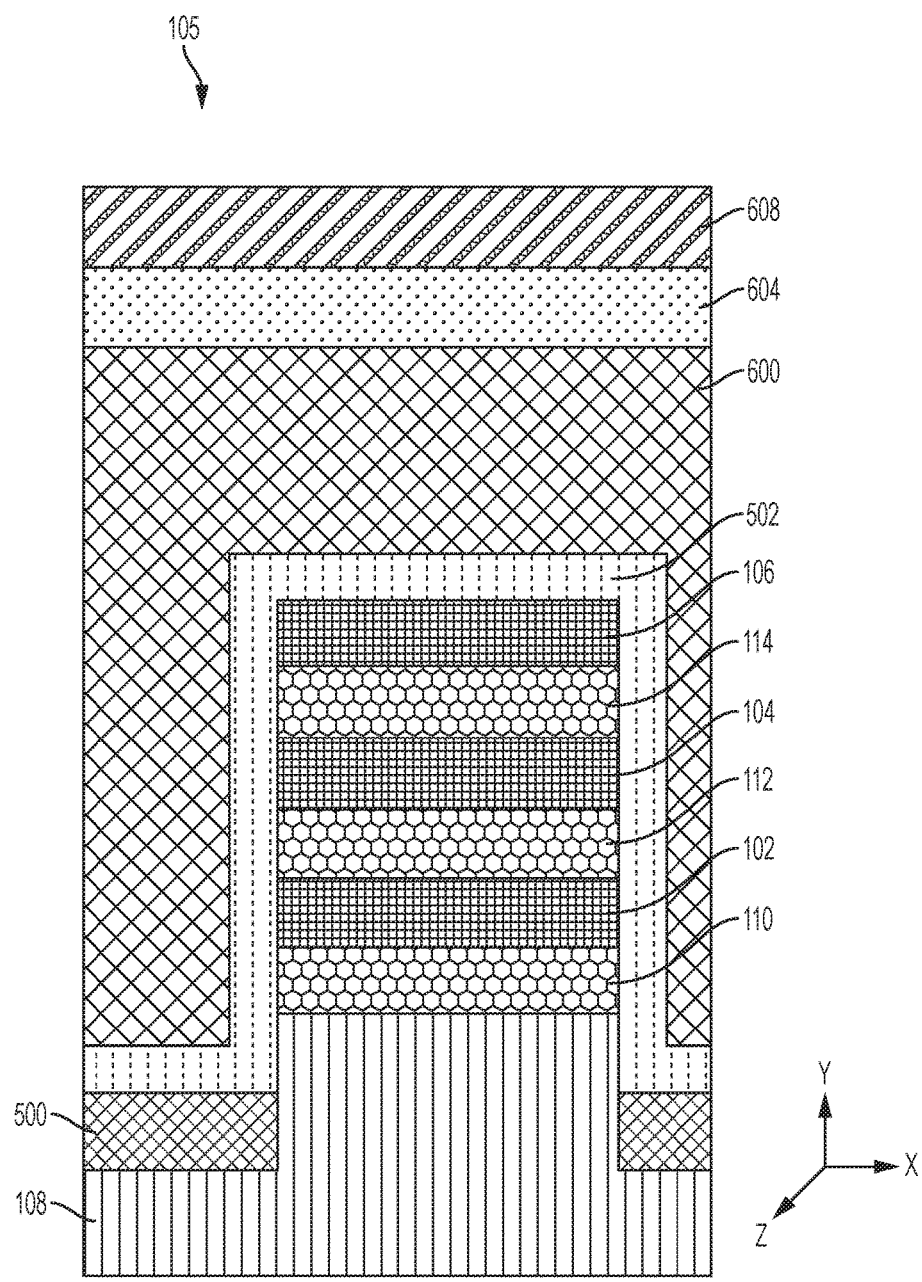
FIG. 6 depicts a cross-sectional view of the nanosheet stack after a fabrication operation according to one or more embodiments of the present invention.

FIG. 6 depicts a cross-sectional view of the nanosheet stack 202 after forming a sacrificial gate 600 over a channel region during a method of fabricating the semiconductor structure 105 according to one or more embodiments of the invention. The sacrificial gate can include, for example, amorphous silicon or polysilicon. In some embodiments of the invention, a hard mask 604 is formed on the sacrificial gate 600. In some embodiments of the invention, the sacrificial gate 600 can be formed by patterning the hard mask 604 and using a wet or dry etch process to remove portions of the sacrificial gate 600 not covered by the pattered hard mask 604. The hard mask 604 can be made of, for example, a silicon nitride. In some embodiments of the invention, second hard mask 608 is formed on the hard mask 604. The hard mask 604 and the second hard mask 608 can form a bilayer hard mask. In some embodiments of the invention, the second hard mask 608 can be an oxide, such as, for example, silicon dioxide.

Figure 7:
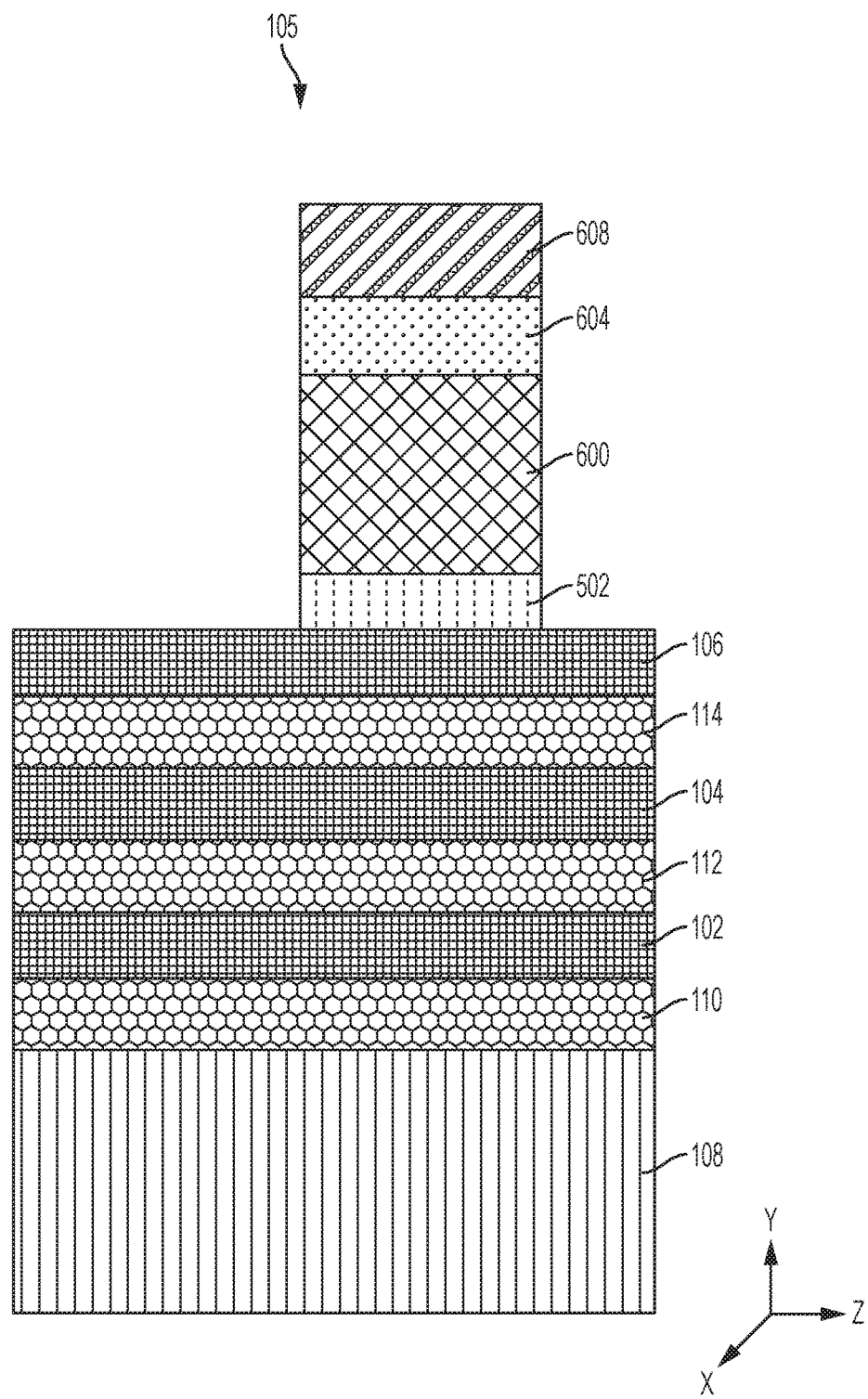
FIG. 7 depicts a cross-sectional view of the nanosheet stack after a fabrication operation according to one or more embodiments of the present invention.

FIG. 7 depicts a cross-sectional view of the nanosheet stack 202 after forming the sacrificial gate 600 during a method of fabricating the semiconductor structure 105 according to one or more embodiments of the invention. The cross-sectional view of FIG. 7 is orthogonal to the cross-sectional view of FIG. 6. Portions of the sacrificial gate 600, portions of the hard masks 604 and 608, and portions of the oxide layer 502 are removed. In some embodiments of the invention, patterning of a sacrificial gate (also known as a dummy gate) can include, for example, a wet etch, a dry etch, or a combination of sequential wet and/or dry etches.

Figure 8:
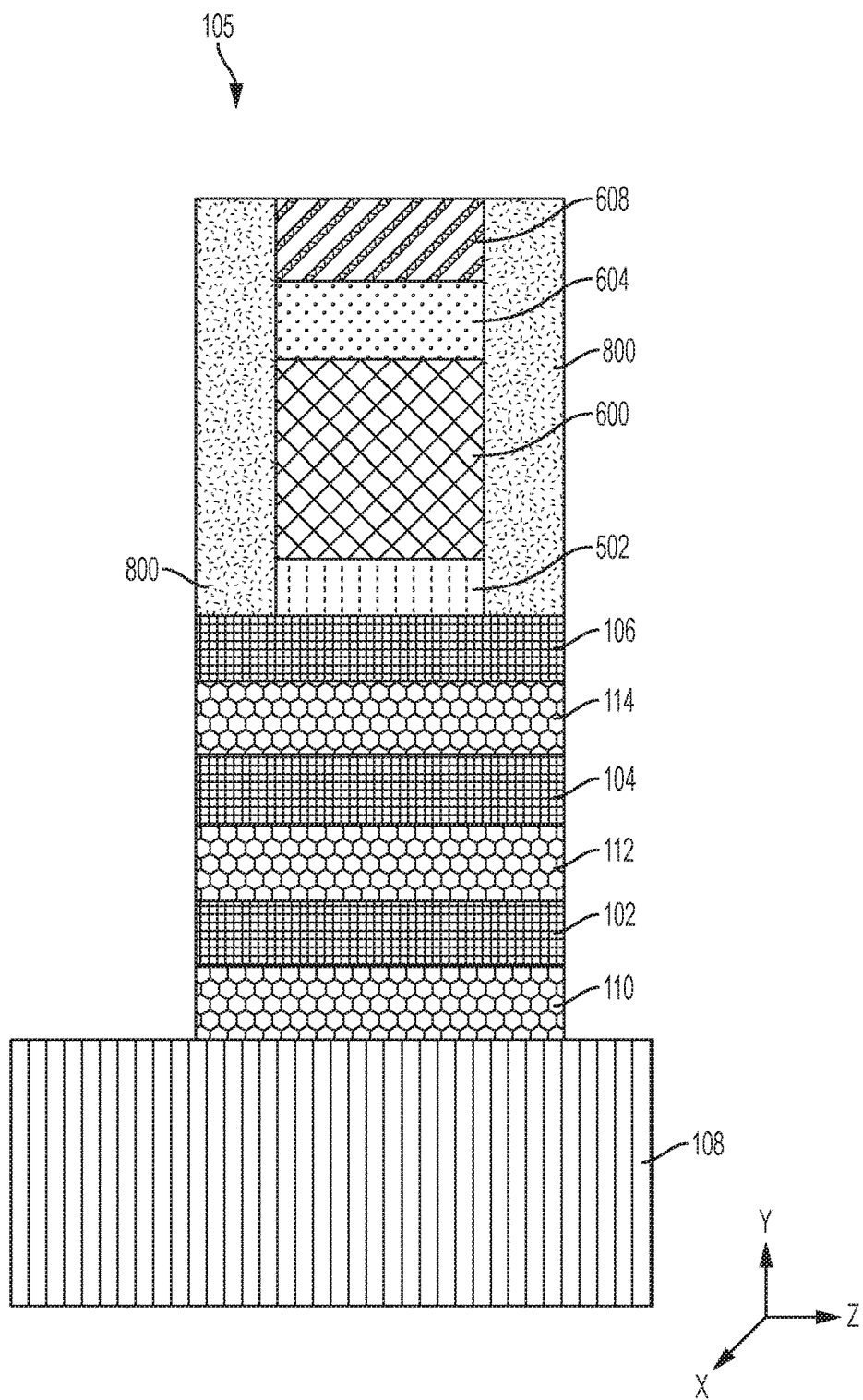
FIG. 8 depicts a cross-sectional view of the nanosheet stack after a fabrication operation according to one or more embodiments of the present invention.

FIG. 8 depicts a cross-sectional view of the nanosheet stack 202 after forming spacers 800 (also known as sidewall spacers) on surfaces of the sacrificial gate 600 during a method of fabricating the semiconductor structure 105 according to one or more embodiments of the invention. In some embodiments of the invention, the spacers 800 can be formed using, for example, a CVD, PECVD, ALD, PVD, chemical solution deposition, in combination with a wet or dry etch process. The spacers 800 can include, for example, a low-k dielectric, a nitride, silicon nitride, silicon dioxide, SiON, SiC, SiOCN, or SiBCN. Portions of the nanosheet stack 202 can be removed, and a surface of the substrate 108 can be exposed. In some embodiments of the invention, patterning the nanosheet stacks can include, for example, a wet etch, a dry etch, or a combination of sequential wet and/or dry etches. In some embodiments of the invention, a directional dry etch can be used. Opposite ends of the nanosheet stack 202 can extend to opposite edges of the spacers 800.

Figure 9:
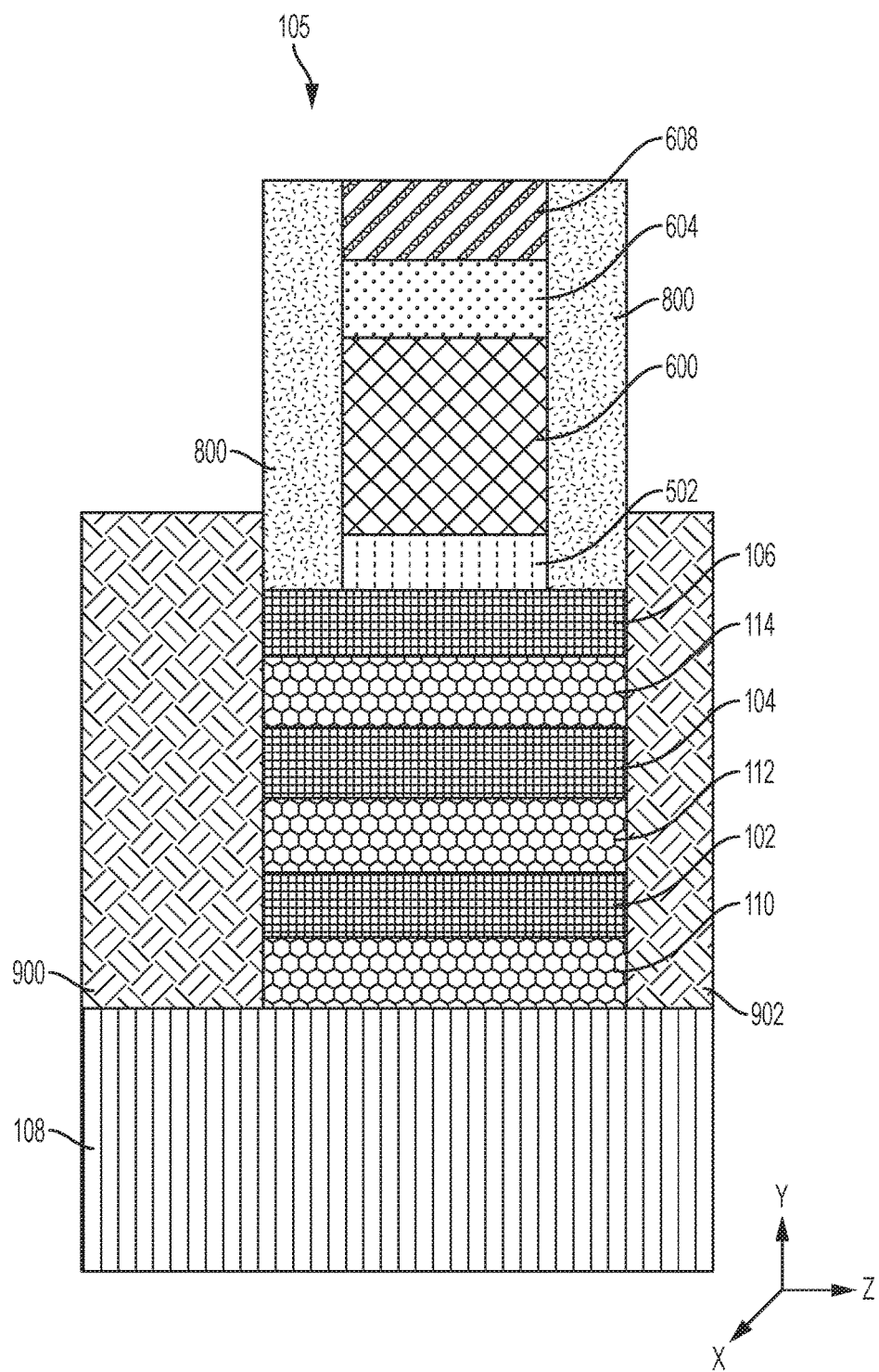
FIG. 9 depicts a cross-sectional view of the nanosheet stack after a fabrication operation according to one or more embodiments of the present invention.

FIG. 9 depicts a cross-sectional view of the nanosheet stack 202 after forming doped regions 900 and 902 during a method of fabricating the semiconductor structure 105 according to one or more embodiments of the invention. The doped regions 900 and 902 are formed on opposite ends of the nanosheet stack 202. The doped regions 900 and 902 are source or drain regions formed in the substrate 108 by a variety of methods, such as, for example, in-situ doped epitaxy, doped following the epitaxy, or by implantation and plasma doping. In some embodiments of the invention, the doped regions 900 and 902 are complementary, such that one of the doped regions can be a source while the other can be a drain.

The doped regions 900 and 902 can be formed by, for example, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, doped regions 900 and 902 can include epitaxial regions grown from each exposed surface or sidewall of the channel nanosheets 102, 104, 106 until the epitaxial regions merge and the doped regions 900 and 902 are formed.

As previously described, materials can be epitaxially grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ and $1 \times 10^{21}$ cm$^{-3}$.

Figure 10:
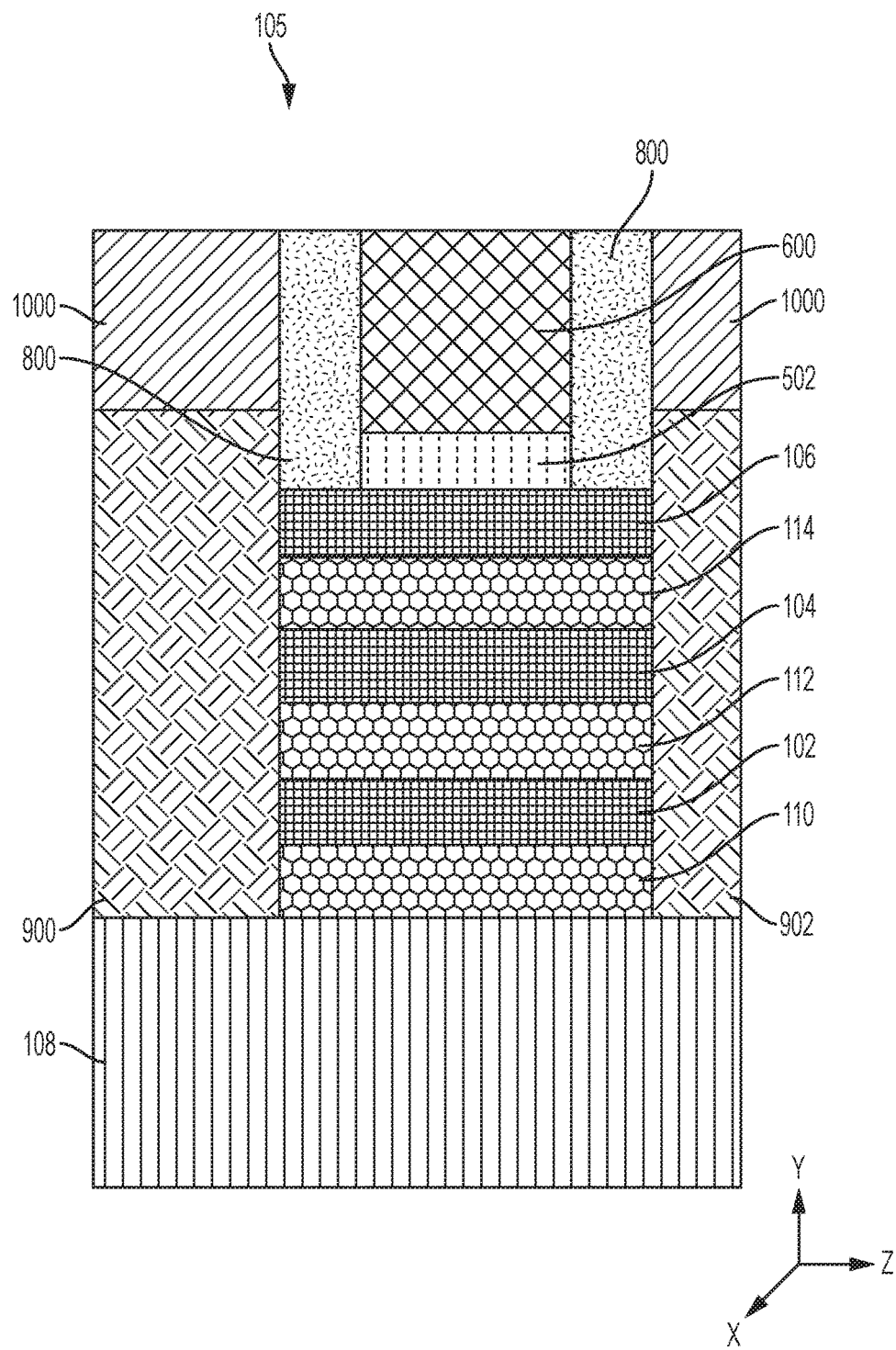
FIG. 10 depicts a cross-sectional view of the nanosheet stack after a fabrication operation according to one or more embodiments of the present invention.

FIG. 10 depicts a cross-sectional view of the nanosheet stack 202 after opening the hard masks 604 and 608 to expose a surface of the sacrificial gate 600 during a method of fabricating the semiconductor structure 105 according to one or more embodiments of the invention. An interlayer dielectric (ILD) 1000 is formed on the doped regions 900 and 902. The ILD 1000 can include, for example, porous silicates, carbon doped oxides, silicon dioxides, silicon nitrides, silicon oxynitrides, or other dielectric materials. The ILD 1000 can be formed using, for example, CVD, PECVD, ALD, flowable CVD, spin-on dielectrics, or PVD. In some embodiments of the invention, the ILD 1000 and the spacers 800 can be planarized to a top surface of sacrificial gate 600, using, for example, a CMP operation. In some embodiments of the invention, the ILD 1000 can include a thin nitride cap layer.

Figure 11:
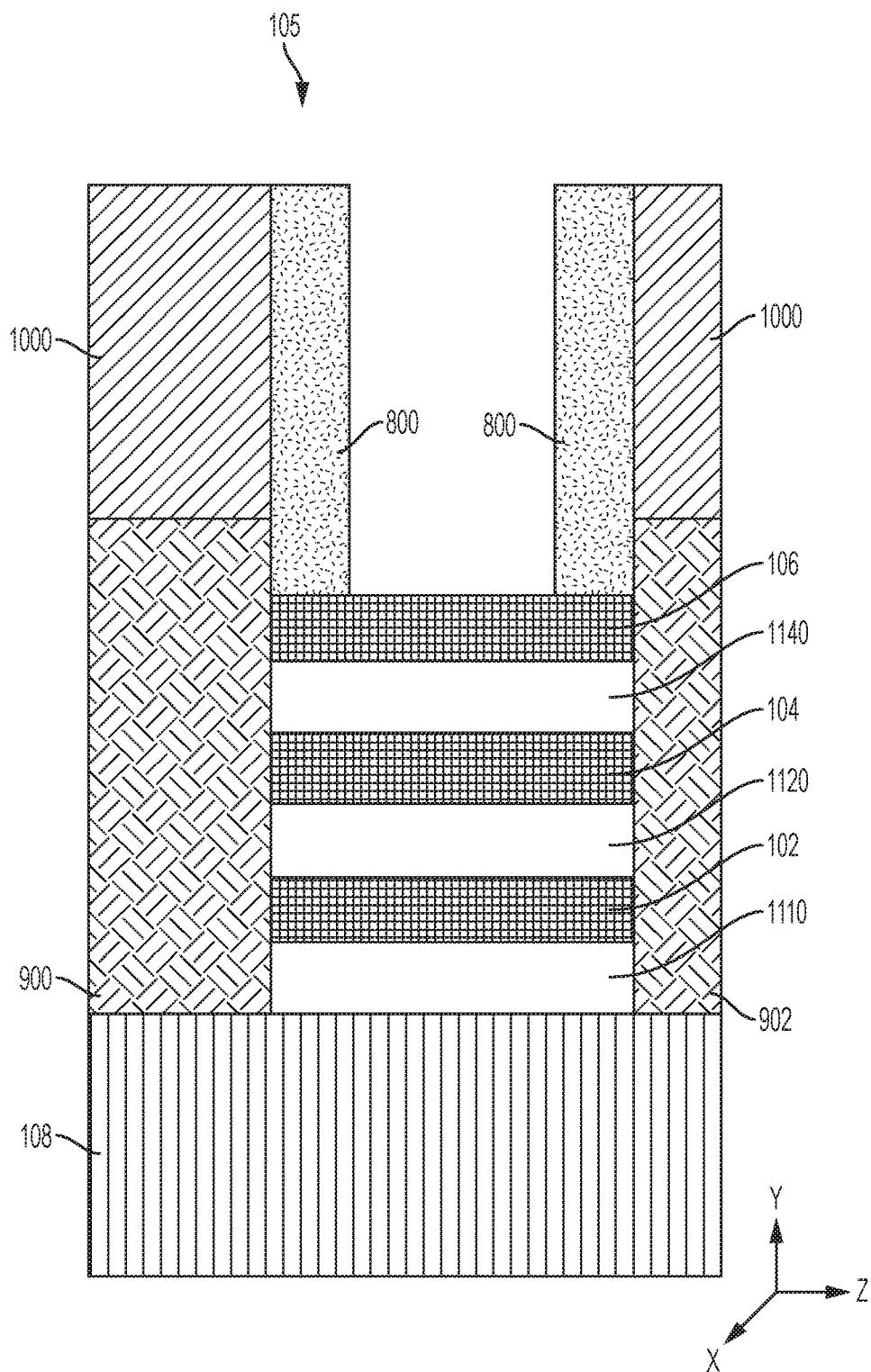
FIG. 11 depicts a cross-sectional view of the nanosheet stack after a fabrication operation according to one or more embodiments of the present invention.

FIG. 11 depicts a cross-sectional view of the nanosheet stack 202 after removing the sacrificial gate 600 during a method of fabricating the semiconductor structure 105 according to one or more embodiments of the invention. In some embodiments of the invention, the oxide layer 502 is removed and the nanosheet stack is exposed.

In an operation that can be referred to herein as a "channel release," the sacrificial nanosheets 110, 112, 114, are removed by a known etching process, e.g., RIE, chemical oxide removal (COR), HCl etch, etc. For example, in some embodiments of the invention, a selective wet or dry etch process can be used to remove the sacrificial nanosheets 110, 112, 114. In some embodiments of the invention, the HCl etch can be a vapor phase etch at a temperature of about 300 to about 700 degrees Celsius. Removal of the sacrificial nanosheets 110, 112, 114 results in formation of cavities 1110, 1110, 1140, respectively.

As previously described, while not depicted in FIGS. 5-11, the fabrication operations depicted in FIGS. 5-11 are simultaneously performed on the first set of nanosheet stacks 201, collectively. Thus, following the fabrication operation depicted in FIG. 11, deposition of dielectric material is performed in accordance with, for example, FIGS. 1a-1c. Deposition of dielectric material performed in accordance with FIGS. 1a-1c can be followed by deposition of dielectric material in accordance with FIGS. 2a-2c.

In some embodiments of the invention, following the fabrication operation depicted in FIG. 11, deposition of the thick dielectric material 1305 is performed in accordance with FIGS. 1a-1c with respect to both the first nanosheet stack 201 and the second nanosheet stack 202. The thick dielectric material 1305 is removed from the second nanosheet stack 202, and deposition of the thin dielectric material 1304 and gate metal 1300 is performed in accordance with FIGS. 2a-2c with respect to the second nanosheet stack 202. The thickness of the removed sacrificial nanosheets 110, 112, 114 is greater than twice a minimum thickness of the thin dielectric material 1304 and less than twice a minimum thickness of the thick dielectric material 1305.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor structure comprising:
   multiple channel nanosheets in multiple first stacks over a substrate, wherein each pair of adjacent stacked channel nanosheets in the first stack is separated by a first gate dielectric material, wherein the first gate dielectric material completely fills an area separating each pair of adjacent stacked channel nanosheets in the first stack; and
   multiple channel nanosheets in a second stack over a substrate, wherein each pair of adjacent stacked channel nanosheets in the first second stack is separated by a work function metal and a second gate dielectric material;
   the first gate dielectric material in the first stacks differing from the second gate dielectric material in the second stack.

2. The semiconductor structure of claim 1, wherein the first gate dielectric material includes silicon oxide, silicon oxynitride, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof.

3. The semiconductor structure of claim 2, wherein the second gate dielectric material includes silicon nitride, boron nitride, hafnium, zirconium or a combination thereof.

4. The semiconductor structure of claim 1, wherein a thickness of the first gate dielectric material is about 6 to about 10 nm.

5. The semiconductor structure of claim 4, wherein a thickness of the work function metal and the second gate dielectric material is about 6 to about 10 nm.

6. The semiconductor structure of claim 1, wherein:
   the first gate dielectric material is formed on sidewalls of the channel nanosheets in the first stacks; and
   a thickness of the first gate dielectric material on the sidewalls of the channel nanosheets in the first stacks is about 3 to about 5 nm.

7. A semiconductor structure comprising:
   multiple channel nanosheets in a first stack over a substrate; and a first gate dielectric material completely filling an area separating each pair of adjacent stacked channel nanosheets in the first stack.

8. The semiconductor structure of claim 7, wherein a thickness of the first gate dielectric material is about 6 to 10 nm.

9. The semiconductor structure of claim 7, wherein the first gate dielectric material includes silicon oxide, silicon oxynitride, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof.

10. The semiconductor structure of claim 7, wherein:
the first gate dielectric material is formed on sidewalls of the channel nanosheets in the first stack; and
a thickness of the first gate dielectric material on the sidewalls of the channel nanosheets in the first stack is about 3 to about 5 nm.

11. The semiconductor structure of claim 7, comprising more than one first stack over the substrate.

12. The semiconductor structure of claim 11, wherein:
the first stacks are arranged in a first direction, and
each channel nanosheet in each first stack has a first dimension in the first direction,
the semiconductor structure further comprising multiple channel nanosheets in a second stack over the substrate, wherein each pair of adjacent stacked channel nanosheets in the second stack is separated by a work function metal and a second gate dielectric material, each channel nanosheet in the second stack having a second dimension in the first direction, the second dimension being greater than the first dimension.

13. The semiconductor structure of claim 12, wherein the second gate dielectric material includes silicon nitride, boron nitride, hafnium, zirconium or a combination thereof.

14. A semiconductor structure, comprising:
a substrate; and
a first stack over the substrate, the first stack including:
channel nanosheets; and
only a first gate dielectric material between each pair of adjacent stacked channel nanosheets.

15. The semiconductor structure of claim 14, wherein:
the channel nanosheets in the first stack define first stack spaces such that each pair of adjacent stacked channel nanosheets in the first stack is separated by one of the first stack spaces; and
the first gate dielectric material completely fills the first stack spaces.

16. The semiconductor structure of claim 14, wherein:
the first gate dielectric material is on sidewalls of the channel nanosheets; and
a thickness of the first gate dielectric material on the sidewalls of the channel nanosheets is about 3 to about 5 nm.

17. The semiconductor structure of claim 14, comprising more than one first stack over the substrate.

18. The semiconductor structure of claim 17, further comprising a second stack over the substrate, wherein:
the second stack includes channel nanosheets and a second gate dielectric material between each pair of adjacent stacked channel nanosheets in the second stack; and
the second gate dielectric material differs from the first gate dielectric material.

19. The semiconductor structure of claim 18, wherein:
the second gate dielectric material includes silicon nitride, boron nitride, hafnium, zirconium or a combination thereof, and
the first gate dielectric material includes silicon oxide, silicon oxynitride, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof.

* * * * *